(12) United States Patent
Mouri et al.

(10) Patent No.: US 10,593,860 B2
(45) Date of Patent: Mar. 17, 2020

(54) PIEZOELECTRIC DEVICE

(71) Applicant: Murata Manufacturing Co., Ltd., Nagaokakyo-shi, Kyoto-fu (JP)

(72) Inventors: Takao Mouri, Nagaokakyo (JP); Kansho Yamamoto, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 540 days.

(21) Appl. No.: 15/355,369

(22) Filed: Nov. 18, 2016

(65) Prior Publication Data

US 2017/0069821 A1 Mar. 9, 2017

Related U.S. Application Data

(63) Continuation of application No. PCT/JP2015/065591, filed on May 29, 2015.

(30) Foreign Application Priority Data

Jun. 12, 2014 (JP) .................. 2014-121564

(51) Int. Cl.
*H01L 41/047* (2006.01)
*H01L 41/09* (2006.01)
(Continued)

(52) U.S. Cl.
CPC .......... *H01L 41/0471* (2013.01); *H01L 41/04* (2013.01); *H01L 41/09* (2013.01);
(Continued)

(58) Field of Classification Search
CPC . H01L 41/0471; H01L 41/04; H01L 41/0973; H01L 41/1138; H03H 9/08
(Continued)

(56) References Cited

U.S. PATENT DOCUMENTS

| 6,441,539 B1* | 8/2002 | Kitamura | ................. H03H 3/02 |
| | | | 310/321 |
| 2005/0110598 A1* | 5/2005 | Larson, III | ............ H03H 9/175 |
| | | | 333/191 |

(Continued)

FOREIGN PATENT DOCUMENTS

| JP | S62-239800 A | 10/1987 |
| JP | H10-256570 A | 9/1998 |

(Continued)

OTHER PUBLICATIONS

International Search Report issued for PCT/JP2015/065591, dated Jul. 7, 2015.

(Continued)

*Primary Examiner* — Bryan P Gordon
(74) *Attorney, Agent, or Firm* — Arent Fox LLP (57) ABSTRACT

A piezoelectric device that includes a substrate defining an opening therein; a piezoelectric layer arranged above the substrate such that at least part of the piezoelectric layer extends over the opening and forms a membrane part that is not superimposed with the substrate; a lower electrode arranged below the piezoelectric layer in at least the membrane part; and an upper electrode that is arranged above the piezoelectric layer so as to face at least part of the lower electrode with the piezoelectric layer interposed therebetween in the membrane part. A heater is arranged above the piezoelectric layer so as to be separate from the upper electrode or at least part of the upper electrode doubles as a heater.

17 Claims, 8 Drawing Sheets

(51) Int. Cl.
  *H01L 41/04*    (2006.01)
  *H01L 41/113*   (2006.01)
  *H01L 41/18*    (2006.01)
  *H04R 17/00*    (2006.01)
  *H04R 17/02*    (2006.01)

(52) U.S. Cl.
  CPC ........ *H01L 41/0973* (2013.01); *H01L 41/113* (2013.01); *H01L 41/1138* (2013.01); *H01L 41/18* (2013.01); *H04R 17/00* (2013.01); *H04R 17/02* (2013.01)

(58) Field of Classification Search
  USPC .......................................................... 310/346
  See application file for complete search history.

(56) References Cited

U.S. PATENT DOCUMENTS

2010/0134209 A1    6/2010  Gabl
2010/0195851 A1*   8/2010  Buccafusca ............ H04R 17/02
                                              381/190
2013/0321101 A1*  12/2013  Burgess ................. H03H 9/175
                                              333/188
2014/0159548 A1*   6/2014  Burak ................ H03H 9/02118
                                              310/346
2015/0318837 A1*  11/2015  Zou .................... H03H 9/02102
                                              333/187

FOREIGN PATENT DOCUMENTS

JP    2009-260723 A    11/2009
JP    2011-082624 A    4/2011

OTHER PUBLICATIONS

Written Opinion of the International Searching Authority issued for PCT/JP2015/065591, dated Jul. 7, 2015.

* cited by examiner

PIEZOELECTRIC DEVICE

CROSS REFERENCE TO RELATED APPLICATIONS

The present application is a continuation of International application No. PCT/JP2015/065591, filed May 29, 2015, which claims priority to Japanese Patent Application No. 2014-121564, filed Jun. 12, 2014, the entire contents of each of which are incorporated herein by reference.

FIELD OF THE INVENTION

The present invention relates to piezoelectric devices.

BACKGROUND OF THE INVENTION

In the related art, a piezoelectric device is known that includes a substrate, a piezoelectric layer that is provided above the substrate and electrodes that are arranged such that the piezoelectric layer is interposed between the electrodes, as described in Japanese Unexamined Patent Application Publication No. 2009-260723 (Patent Document 1) for example. Such a piezoelectric device is used in filters, actuators, sensors and so forth.

As an example of such a piezoelectric device, a MEMS device that includes a transducer, a substrate and a temperature compensation element is disclosed in paragraphs 0017 to 0023 and FIGS. 1A and 1B of U.S. Patent Application Publication No. 2010/0195851 A1 (Patent Document 2). The transducer is, for example, a piezoelectric ultrasonic transducer that undergoes bending vibration and is arranged above the substrate. The temperature compensation element is a heater element, for example, and is arranged on the substrate around the periphery of the transducer on the lower surface side of the transducer.

Furthermore, a 3×3 sensor array that includes sensor elements, a substrate and heater elements is disclosed in paragraphs 0070 to 0076 and FIGS. 2A and 2B of U.S. Patent Application Publication No. 2010/0134209 A1 (Patent Document 3). Each of the sensor elements is a piezoelectric resonance element that includes a piezoelectric layer and two electrodes that are arranged on an upper surface of the piezoelectric layer and the sensor elements are arranged on the substrate. The heater elements are arranged on the substrate around the peripheries of the sensor elements.

Patent Document 1: Japanese Unexamined Patent Application Publication No. 2009-260723
Patent Document 2: U.S. Patent Application Publication No. 2010/0195851 A1
Patent Document 3: U.S. Patent Application Publication No. 2010/0134209 A1

SUMMARY OF THE INVENTION

However, the piezoelectric devices described in Patent Documents 2 and 3 have the following problems.

Problem 1—Most of the heat generated by a heater element is transmitted to the substrate when the substrate is a silicon substrate having a large heat capacity since the heater element is in contact with the substrate, and therefore the heater element cannot effectively heat the piezoelectric layer and the electrodes, which are to be heated. In other words, much of the heat generated by the heater element is lost.

Problem 2—Although condensation may form on the surfaces of the piezoelectric layer and electrodes, since the heater element is arranged on the substrate, the heater element cannot directly heat the parts on which condensation forms.

Problem 3—A manufacturing step for forming the heater element is specially needed and the manufacturing process consequently becomes more complex.

Accordingly, an object of the present invention is to provide a piezoelectric device that can solve these problems.

In order to achieve this object, a piezoelectric device according to the present invention includes a substrate defining an opening therein; a piezoelectric layer that is directly or indirectly supported by the substrate and is arranged above the substrate such that at least part of the piezoelectric layer forms a membrane part that is not superimposed with the substrate; a lower electrode that is arranged below the piezoelectric layer in at least the membrane part; and an upper electrode that is arranged above the piezoelectric layer so as to face at least part of the lower electrode with the piezoelectric layer interposed therebetween in the membrane part; wherein a heater is arranged above the piezoelectric layer so as to be separate from the upper electrode or at least part of the upper electrode doubles as a heater.

According to the present invention, the following effects are realized.

Since the heater is not in contact with the substrate, it is unlikely that most of the heat generated by the heater will be transmitted to the substrate even when the substrate is a silicon substrate having a large heat capacity and therefore the piezoelectric layer and the electrodes, which are to be heated, can be effectively heated. In other words, there is little loss of the heat generated by the heater.

Although condensation may form on the surfaces of the piezoelectric layer and the electrodes as a result of the device being used as a piezoelectric device, since the heater is arranged on the upper surface of the piezoelectric layer, the heater can directly heat the parts on which the condensation forms.

In some embodiments, since the heater is arranged on the same surface as the upper electrode, the upper electrode and the heater can be formed at the same time and therefore the manufacturing process is not complex.

DETAILED DESCRIPTION OF THE PREFERRED EMBODIMENTS

Embodiment 1

A piezoelectric device according to embodiment 1 of the present invention will be described while referring to FIGS. 1 and 2. FIG. 2 is a sectional view looking in the direction of arrows and taken along line II-II in FIG. 1.

A piezoelectric device 101 of this embodiment includes: a substrate 1 defining an opening 8 therein; a piezoelectric layer 4 that is directly or indirectly supported by the substrate 1 and is arranged above the substrate 1 such that at least part of the piezoelectric layer 4 is included in a membrane part 7 that is not superimposed with the substrate 1; a lower electrode 3 that is arranged below the piezoelectric layer 4 in at least the membrane part 7; and an upper electrode 5 that is arranged above the piezoelectric layer 4 so as to face at least part of the lower electrode 3 with the piezoelectric layer 4 interposed therebetween in the membrane part 7. A heater 6 is arranged above the piezoelectric layer 4 so as to be separate from the upper electrode 5 (or at least part of the upper electrode 5 doubles as the heater 6 as described herein in relation to other embodiments). In the piezoelectric device 101 according to this embodiment, the heater 6 is arranged above the piezoelectric layer 4 so as to be separate from the upper electrode 5.

Figure 1:
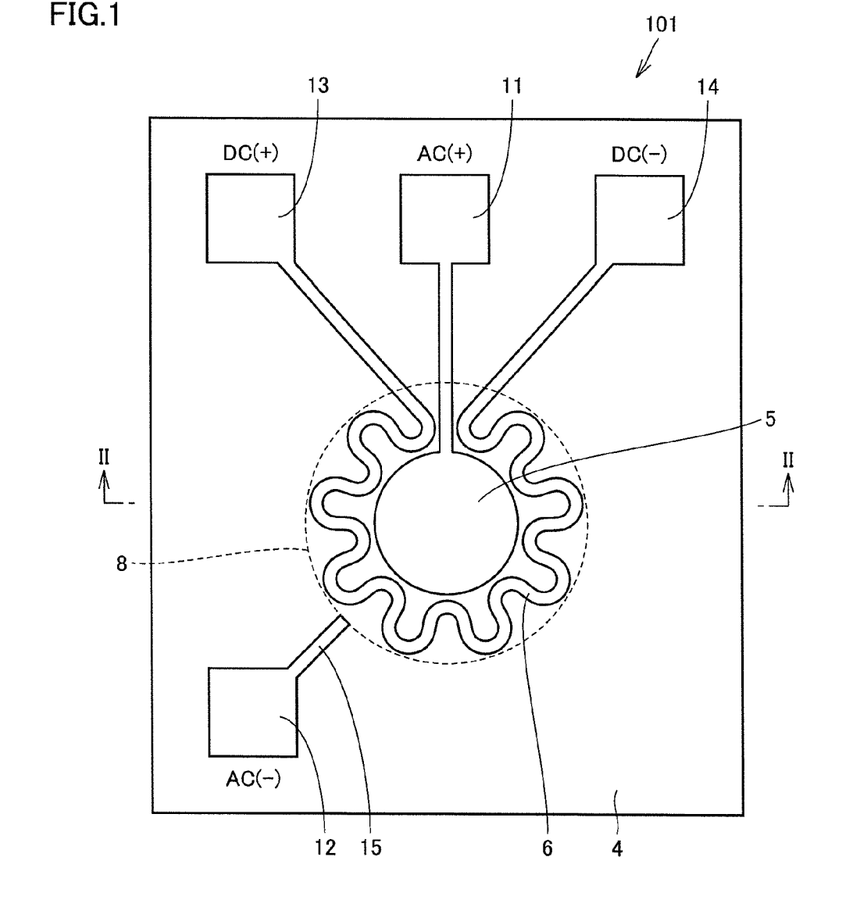
FIG. 1 is a plan view of a piezoelectric device of embodiment 1 of the present invention.
Figure 2:
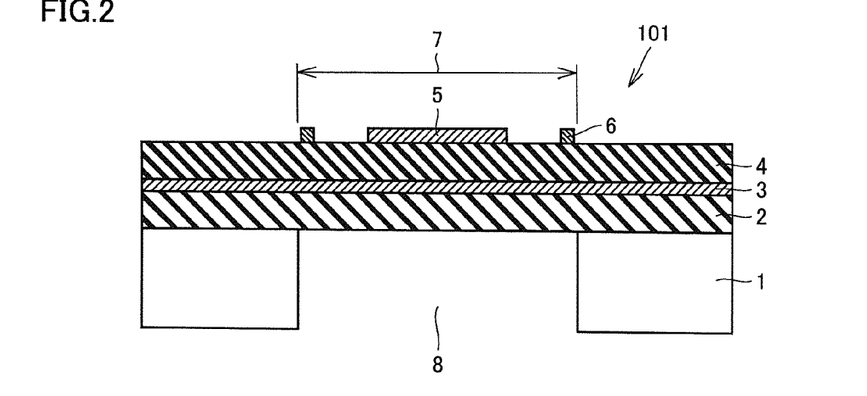
FIG. 2 is a sectional view looking in the direction of arrows and taken along line II-II in FIG. 1.

As illustrated in FIG. 1, electrodes 11 to 14 are provided on the upper surface of the piezoelectric layer 4, and the electrode 11 is connected to the upper electrode 5 and the electrode 12 is connected to the lower electrode 3. Since the lower electrode 3 is located at the height of the lower surface of the piezoelectric layer 4 rather than at the height of the upper surface of the piezoelectric layer 4, a wiring line 15, which is led out from the electrode 12, penetrates through the piezoelectric layer 4 in the thickness direction midway therealong. Therefore, in FIG. 1, it looks as though the wiring line 15 is cut off midway therealong.

The substrate 1 is a silicon substrate, for example. A through hole 8 is provided in a central portion as indicated by the broken line in FIG. 1. The through hole 8 can be formed by etching the substrate 1 from the lower surface side of the substrate 1.

Parts of a support layer 2, the lower electrode 3, the piezoelectric layer 4 and the upper electrode 5 that are disposed above the through hole 8 form the membrane part 7. The membrane part 7 has a constant width and is able to vibrate. The membrane part 7 is not superimposed with the substrate 1. In this embodiment, as illustrated in FIG. 2, the region occupied by the membrane part 7 substantially coincides with that occupied by the through hole 8.

In this embodiment, as illustrated in FIG. 1, the upper electrode 5 is provided as a circular conductive film in a central portion of a region that is superimposed with the through hole 8. A part of the upper electrode 5 that is located in the membrane part 7 and faces the lower electrode 3 can function as a driving/detection electrode. In this embodiment, the entirety of the upper electrode 5 is located inside the membrane part 7.

The piezoelectric layer 4 may be directly or indirectly supported by the substrate 1. In this embodiment, as illustrated in FIG. 2, the support layer 2 is supported by the substrate 1 and the piezoelectric layer 4 is placed on the upper side of the support layer 2 with the lower electrode 3 interposed therebetween. The piezoelectric layer 4 may be supported in this manner. Even when the support layer 2 is interposed in this manner, it can be said that the piezoelectric layer 4 is indirectly supported by the substrate 1. The support layer 2 may be a layer that is composed a material such as AlN, SiN or $SiO_2$. In the piezoelectric device 101 according to this embodiment, the support layer 2 and the piezoelectric layer 4 are both composed of AlN. The piezoelectric layer 4 is provided above the support layer 2 and the lower electrode 3. Although an example is described in this embodiment that includes the support layer 2, the presence of the support layer 2 is not essential.

In this embodiment, the lower electrode 3 is provided so as to cover the entirety of the piezoelectric layer 4. However, the lower electrode 3 does not necessarily have be provided so as to be this wide, and it is sufficient that the lower electrode 3 at least be provided in a region that is superimposed with the upper electrode 5 in the membrane part 7. For example, the upper electrode 5 is illustrated as a circular conductive film in the central portion in FIG. 1, and the lower electrode 3 may also be similarly provided as a circular conductive film of the same size in the central portion. A part of the lower electrode 3 that is located in the membrane part 7 and faces the upper electrode 5 can function as a driving/detection electrode.

The heater 6 does not contact the substrate 1. The heater 6 is arranged on the upper surface of the piezoelectric layer 4 so as to surround the upper electrode 5. However, the upper electrode 5, which can function as a driving/detection electrode, and the heater 6 are electrically insulated from each other. In this embodiment, as illustrated in FIG. 2, the heater 6 is formed on the same surface as the upper electrode 5. The heater 6 and the upper electrode 5 may be formed of the same material. The heater 6 and the upper electrode 5 may be formed at the same time as each other in the same step.

In the case where the piezoelectric device is an ultrasonic transducer, at least either of the upper electrode and the lower electrode functions as a driving electrode and/or detection electrode in the part where the upper electrode and the lower electrode face each other. In the case where the piezoelectric device is an actuator, at least either of the upper electrode and the lower electrode functions as a driving electrode in the part where the upper electrode and the lower electrode face each other. In the case where the piezoelectric device is a sensor, at least either of the upper electrode and the lower electrode functions as a detection electrode in the part where the upper electrode and the lower electrode face each other.

In the case where the piezoelectric device is an ultrasonic transducer and performs "transmission", an alternating-current signal is applied between the upper electrode 5 and the lower electrode 3, and as a result the membrane part 7 vibrates and sound waves are generated.

In addition, in the case where the piezoelectric device is an ultrasonic transducer and performs "reception", charge is generated in the piezoelectric layer 4 when the membrane part 7 is displaced by sound waves from the outside and the generated charge is output from the set of electrodes composed of the upper electrode 5 and the lower electrode 3.

The membrane part 7 can be heated by applying a direct-current current or an offset alternating-current current to the heater 6. In this way, it is possible to make it difficult for condensation to form on the surfaces of the membrane part 7. The term "surfaces of the membrane part 7" used here does not refer to just the upper surfaces of the piezoelectric layer 4 and the upper electrode 5 and this term also includes the lower surface of the support body 2.

In addition, even when condensation does form on the surfaces of the membrane part 7, the membrane part 7 is heated by the heater 6 and consequently the attached moisture can be evaporated and removed. The membrane part 7 has a small heat capacity and therefore can be heated in a short period of time. At this time, since the heater 6 is not in contact with the substrate 1, it is unlikely that most of the heat generated by the heater 6 will be transmitted to the substrate 1 even when the substrate 1 is a silicon substrate having a large heat capacity and the piezoelectric layer 4 and the electrode upper part 5, which are to be heated, can be effectively heated. In other words, there is little loss of the heat generated by the heater 6.

The effects achieved by the piezoelectric device according to the embodiment are as follows.

Since the heater is not in contact with the substrate, it is unlikely that most of the heat generated by the heater will be transmitted to the substrate even when the substrate is a silicon substrate having a large heat capacity and therefore the piezoelectric layer and the electrodes, which are to be heated, can be effectively heated. In other words, there is little loss of the heat generated by the heater.

Although condensation may form on the surfaces of the piezoelectric layer and the electrodes as a result of the device being used as a piezoelectric device, since the heater is arranged on the upper surface of the piezoelectric layer. The heater can directly heat the parts on which condensation forms.

Since the heater is arranged on the same surface as the upper electrode, the upper electrode and the heater can be formed at the same time and therefore the manufacturing process is not complex.

It is preferable that the main material of the piezoelectric layer 4 be AlN as described in this embodiment. AlN has high heat resistance and high thermal conductivity and therefore when AlN is used as the main material of the piezoelectric layer 4, heat can be efficiently transmitted through the piezoelectric layer 4 when the heater operates and the heater can heat the membrane part 7 substantially uniformly.

It is preferable that the support layer 2 be arranged above the substrate 1 and that the piezoelectric layer 4 be supported by the substrate 1 with the support layer 2 interposed therebetween, as described in this embodiment. By adopting this configuration, the piezoelectric layer 4 can be supported in a stable posture.

It is preferable that AlN be the main material of the support layer 2. When the main material of the support layer 2 is AlN, the support layer 2 can function as an etching stopper in reactive ion etching (deep reactive ion etching) for forming the through hole 8 in the substrate 1. When the support layer 2 functions as an etching stopper, variations in the thickness of the piezoelectric layer 4 caused by etching for forming the through hole 8 can be prevented and therefore the occurrence of structural variations can be reduced.

It is preferable that the substrate 1 have the through hole 8 and that the membrane part 7 be provided so as to be superimposed with the through hole 8, as described in this embodiment. By adopting this configuration, the substrate 1 is able to support the membrane part 7 so as to surround the membrane part 7 and therefore the substrate 1 can stably support the membrane part 7.

It is preferable that a protective film be provided so as to cover the upper electrode 5 and the piezoelectric layer 4. This is because the upper electrode 5 and the piezoelectric layer 4 can be prevented from being damaged when a protective film is provided and a piezoelectric device having high reliability can be realized. AlN, SiN, $SiO_2$ or the like can be used as the material of the protective layer in this case.

It is preferable that the main material of the protective film be AlN. When the main material of the protective film is AlN, the protective film and the piezoelectric layer 4 can be formed of the same or substantially the same material and consequently the membrane part 7 is unlikely to deform when heated by the heater 6, which is preferable.

It is preferable that at least part of the heater 6 have a meandering shape in plan view. The heater 6 illustrated in FIG. 1 satisfies this condition. As a result of the heater 6 having a meandering shape, the heater 6 can be efficiently arranged within a limited area and the required amount of heat can be generated.

The upper electrode 5 and the lower electrode 3 are composed of any one of the metals Mo, W and Ru or are composed of an alloy containing at least one of these metals. In this case, the coefficients of linear expansion of the upper electrode 5 and the lower electrode 3 are close to the coefficient of linear expansion of the piezoelectric layer composed of AlN and it is unlikely that unwanted deformation will occur in the membrane part 7 as a result of the membrane part 7 being heated. In addition, when the upper electrode 5 and the lower electrode 3 are composed of any one of the metals Mo, W and Ru or are composed of an alloy containing at least one of these metals, since the melting point of the material is high, the melting point is unlikely to be reached even when the material is heated by the heater 6 and therefore the effect on the material of being heated is very small. When the lower electrode 3 is composed of any one of the metals Mo, W and Ru or is composed of an alloy containing at least one of these metals, the orientation of the AlN of the piezoelectric layer 4 can be improved. The upper electrode 5 and the lower electrode 3 may be formed of the same material or may be formed of different materials.

Embodiment 2

Figure 3:
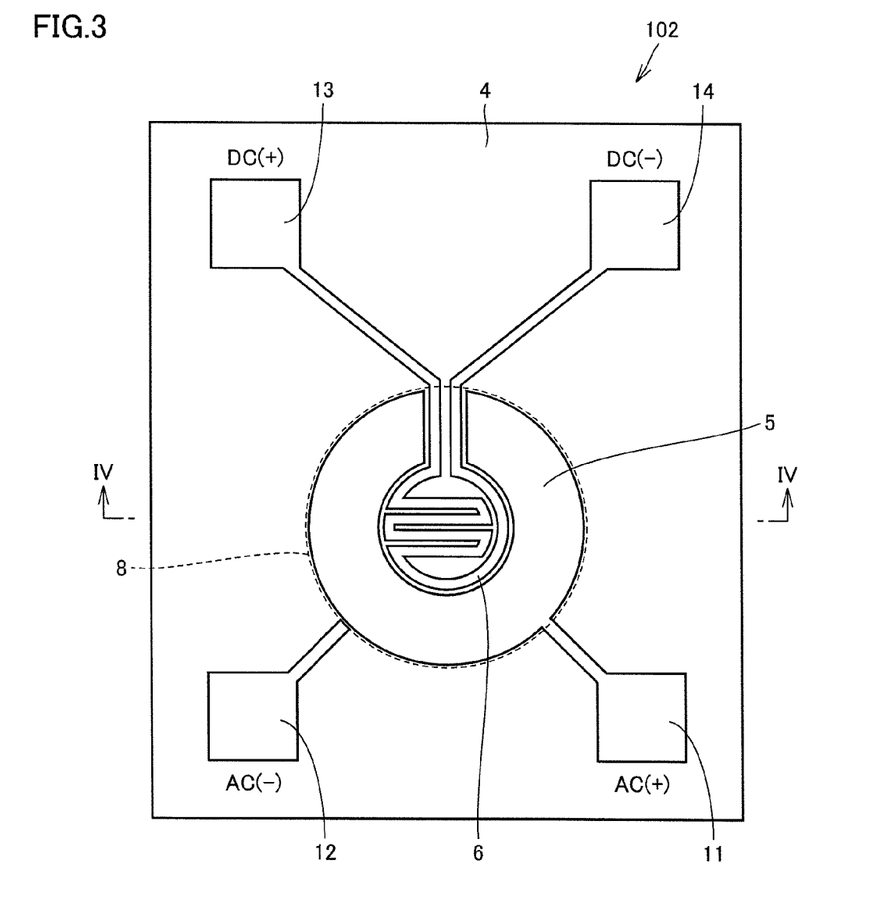
FIG. 3 is a plan view of a piezoelectric device of embodiment 2 of the present invention.
Figure 4:
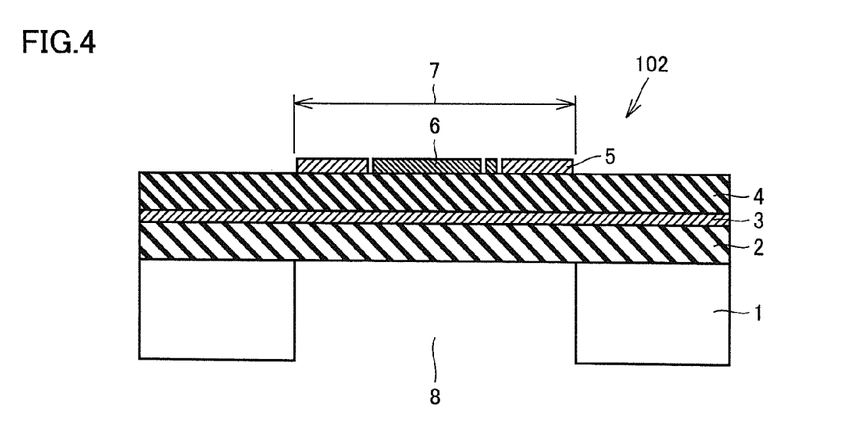
FIG. 4 is a sectional view looking in the direction of arrows and taken along line IV-IV in FIG. 3.

A piezoelectric device according to embodiment 2 of the present invention will be described while referring to FIGS. 3 and 4. FIG. 4 is a sectional view looking in the direction of arrows and taken along line IV-IV in FIG. 3.

The basic configuration of a piezoelectric device 102 according to this embodiment is similar to that of the piezoelectric device 101 described in embodiment 1. In embodiment 1, the entirety of the upper electrode 5 functions as a driving/detection electrode, the upper electrode 5 is provided in a central portion of the projected area of the through hole 8 and the heater 6 is provided so as to surround the periphery of the upper electrode 5, which functions as a driving/detection electrode. In contrast, in this embodiment, conversely, the heater 6 is arranged in the center of the projected area of the through hole 8 and the upper electrode 5, which can function as a driving/detection electrode, is provided so as to surround the periphery of the heater 6.

The upper electrode 5, which can function as a driving/detection electrode, has the shape of the letter C. In contrast, the lower electrode 3 may be provided over the entirety of the piezoelectric layer 4 or may be provided in the same shape as the upper electrode 5. The upper electrode 5 has a shape obtained by removing a piece from a ring shape, but the lower electrode 3 may have the shape of a complete ring. It is sufficient that the lower electrode 3 exist in at least a region that is superimposed with the upper electrode 5 in the membrane part 7. The upper electrode 5 faces at least part of the lower electrode 3. As illustrated in FIG. 3, at least part of the heater 6 has a meandering shape in plan view. The upper electrode 5, which can function as a driving/detection electrode, and the heater 6 are electrically insulated from each other.

The same effects as in embodiment 1 can be obtained in this embodiment as well.

Embodiment 3

Figure 5:
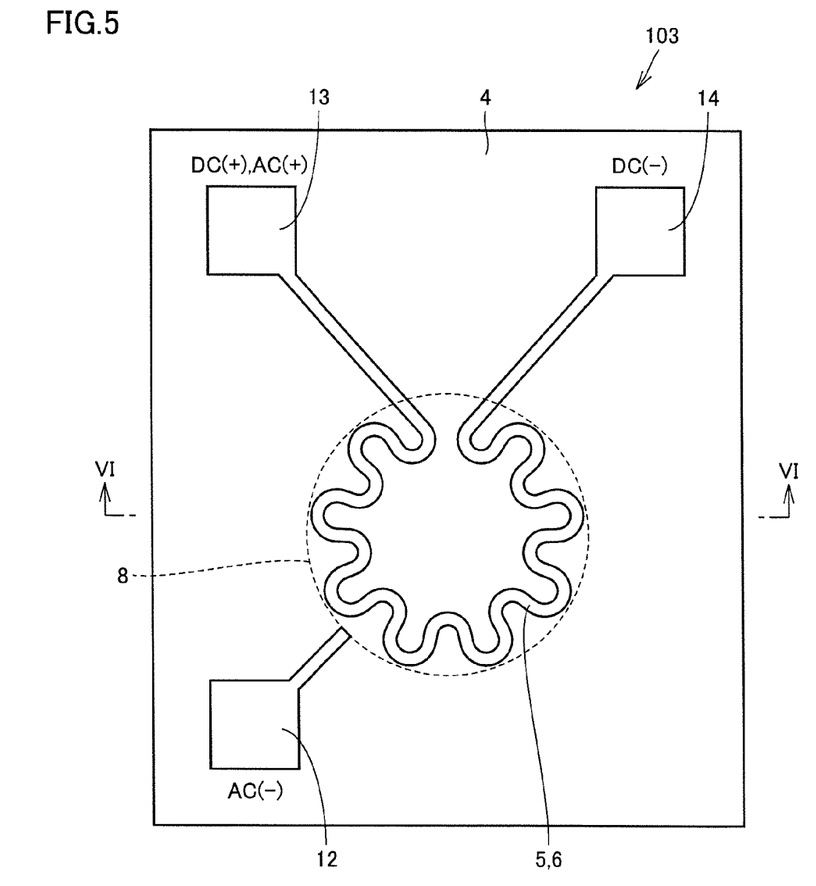
FIG. 5 is a plan view of a piezoelectric device of embodiment 3 of the present invention.
Figure 6:
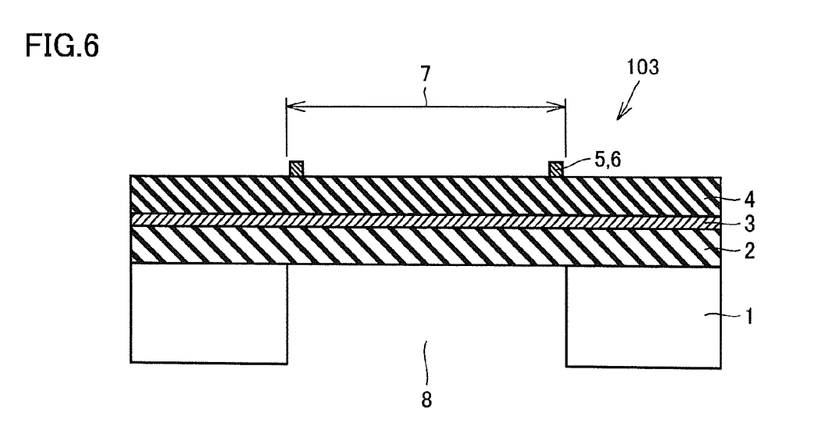
FIG. 6 is a sectional view looking in the direction of arrows and taken along line VI-VI in FIG. 5.

A piezoelectric device according to embodiment 3 of the present invention will be described while referring to FIGS. 5 and 6. FIG. 6 is a sectional view looking in the direction of arrows and taken along line VI-VI in FIG. 5.

The basic configuration of a piezoelectric device 103 according to this embodiment is similar to that of the piezoelectric device 101 described in embodiment 1. However, there is the following difference. In the piezoelectric device 103, rather than the heater 6 being arranged above the piezoelectric layer 4 so as to be separate from the upper electrode 5, the upper electrode 5 doubles as the heater 6.

The upper electrode 5/heater 6 is arranged so as to extend along the outer edge of the through hole 8 in plan view. The upper electrode 5/heater 6 has a meandering shape in plan view. Since the upper electrode 5 faces the lower electrode 3 when the upper electrode 5 is formed in this way as well, the upper electrode 5 can function as a driving electrode and/or a detection electrode. The lower electrode 3 may be arranged over the entirety of the piezoelectric layer 4, or the lower electrode 3 may instead be arranged in a ring shape so as to face the upper electrode 5 with the piezoelectric layer 4 interposed therebetween and so as to extend along an outer peripheral portion of the through hole 8 on the inner side of the through hole 8.

The same effects as in embodiment 1 can be obtained in this embodiment as well. Since the upper electrode 5 doubles as the heater 6, the overall size of the piezoelectric device can be reduced.

Embodiment 4

Figure 7:
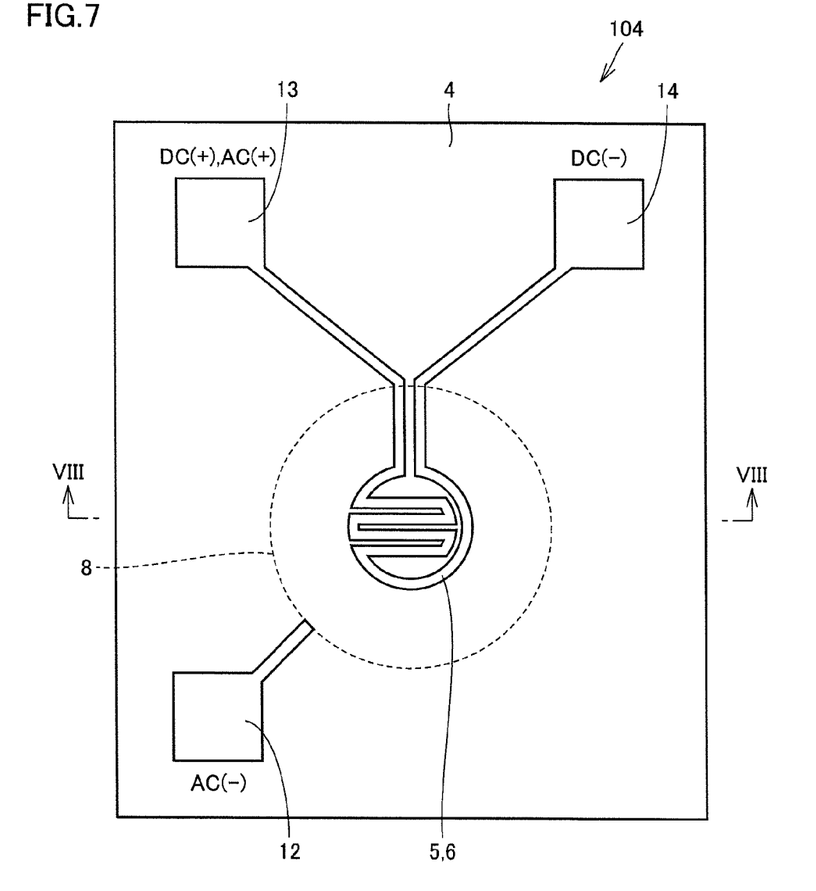
FIG. 7 is a plan view of a piezoelectric device of embodiment 4 of the present invention.
Figure 8:
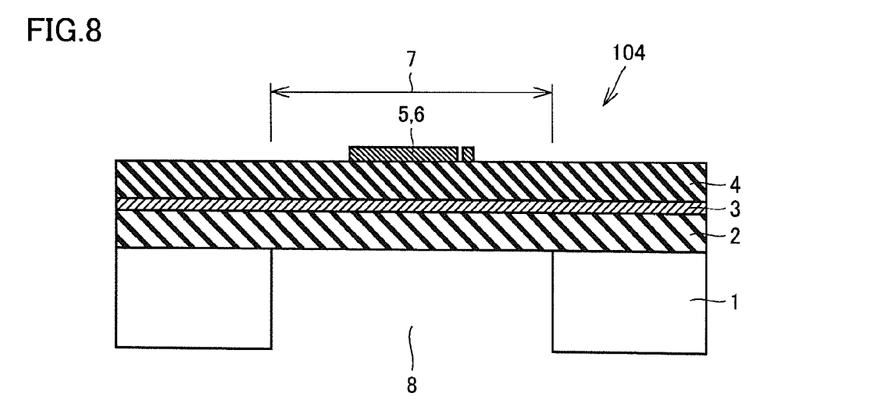
FIG. 8 is a sectional view looking in the direction of arrows and taken along line VIII-VIII in FIG. 7.

A piezoelectric device according to embodiment 4 of the present invention will be described while referring to FIGS. 7 and 8. FIG. 8 is a sectional view looking in the direction of arrows and taken along line VIII-VIII in FIG. 7.

The basic configuration of a piezoelectric device 104 according to this embodiment is similar to that of the piezoelectric device 103 described in embodiment 3. However, there is the following difference. The upper electrode 5/heater 6 is arranged so as to extend along an outer peripheral portion of the through hole 8 in plan view in the piezoelectric device 103, whereas the upper electrode 5/heater 6 is arranged so as to be located in a central portion of the through hole 8 in plan view in the piezoelectric device 104 according to this embodiment. Part of the upper electrode 5/heater 6 has a meandering shape. Since the upper electrode 5 faces the lower electrode 3 when the upper electrode 5 is formed in this way as well, the upper electrode 5 can function as a driving electrode and/or a detection electrode. The lower electrode 3 may be arranged over the entirety of the piezoelectric layer 4, or the lower electrode 3 may instead be arranged as a circular member in a central portion of the through hole 8 so as to face the upper electrode 5 with the piezoelectric layer 4 interposed therebetween.

The same effects as in embodiment 3 can be obtained in this embodiment as well.

Embodiment 5

Figure 9:
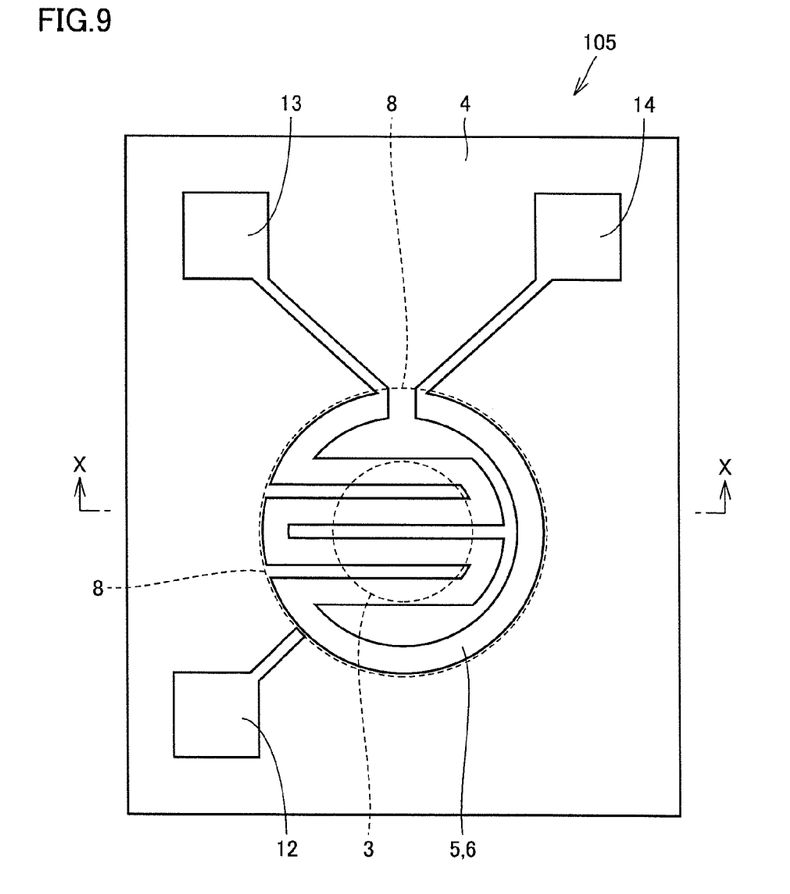
FIG. 9 is a plan view of a piezoelectric device of embodiment 5 of the present invention.
Figure 10:
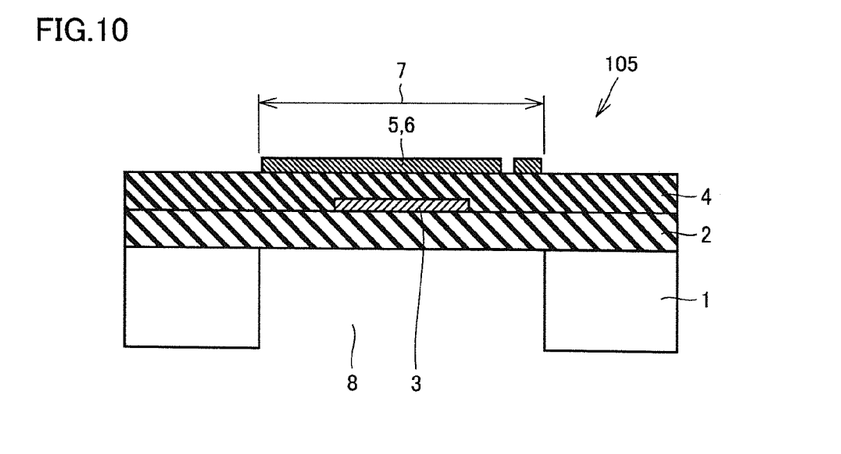
FIG. 10 is a sectional view looking in the direction of arrows and taken along line X-X in FIG. 9.
Figure 11:
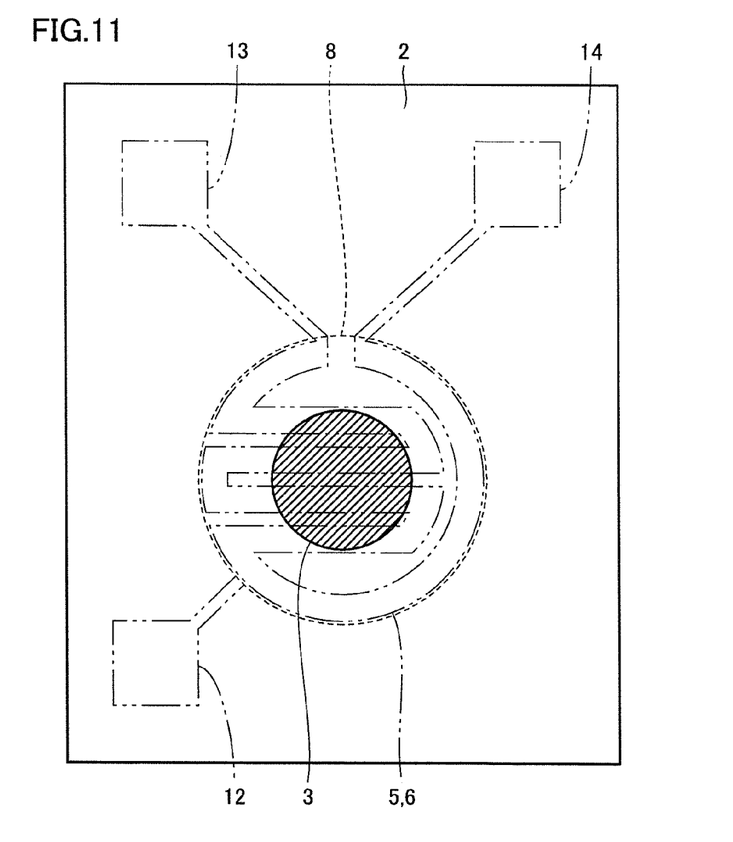
FIG. 11 is an explanatory diagram of a lower electrode of a piezoelectric device of embodiment 5 of the present invention.

A piezoelectric device according to embodiment 5 of the present invention will be described while referring to FIGS. 9 to 11. FIG. 9 is a plan view of a piezoelectric device 105 according to this embodiment. FIG. 10 is a sectional view looking in the direction of arrows and taken along line X-X in FIG. 9. FIG. 11 illustrates a state in which the piezoelectric layer 4 and members above the piezoelectric layer 4 have been removed from the piezoelectric device 105. In FIG. 11, members that exist this side of the lower electrode 3 are illustrated using two-dot chain lines. As illustrated in FIG. 11, a circular lower electrode 3 is arranged on an upper surface of the support layer 2.

The basic configuration of the piezoelectric device 105 according to this embodiment is similar to that of the piezoelectric device 104 described in embodiment 4. However, there is the following difference. In the piezoelectric device 104, the upper electrode 5/heater 6 is arranged so as to be located in a central portion of the through hole 8 in plan view, whereas, in the piezoelectric device 105 according to this embodiment, the upper electrode 5/heater 6 is arranged so as to occupy substantially the entirety of through hole 8 in plan view. On the other hand, the lower electrode 3 is arranged so as to be superimposed with a central portion of the upper electrode 5/heater 6. In other words, the lower electrode 3 is arranged in only a central portion of the membrane part 7. The lower electrode 3 has a circular shape.

Part of the upper electrode 5/heater 6 has a meandering shape and the part of the upper electrode 5/heater 6 that has a meandering shape faces the lower electrode 3 with the piezoelectric layer 4 interposed therebetween.

In FIG. 9, for convenience of explanation, the outline of the through hole 8 is illustrated as being slightly shifted toward the outside from the outline of the upper electrode 5/heater 6, but in reality these outlines may coincide with each other. In addition, the outline of the through hole 8 is not limited to being outside the outline of the upper electrode 5/heater 6 and may instead be positioned inside the outline of the upper electrode 5/heater 6.

The same effects as in embodiment 3 can be obtained in this embodiment as well.

Embodiment 6

Figure 12:
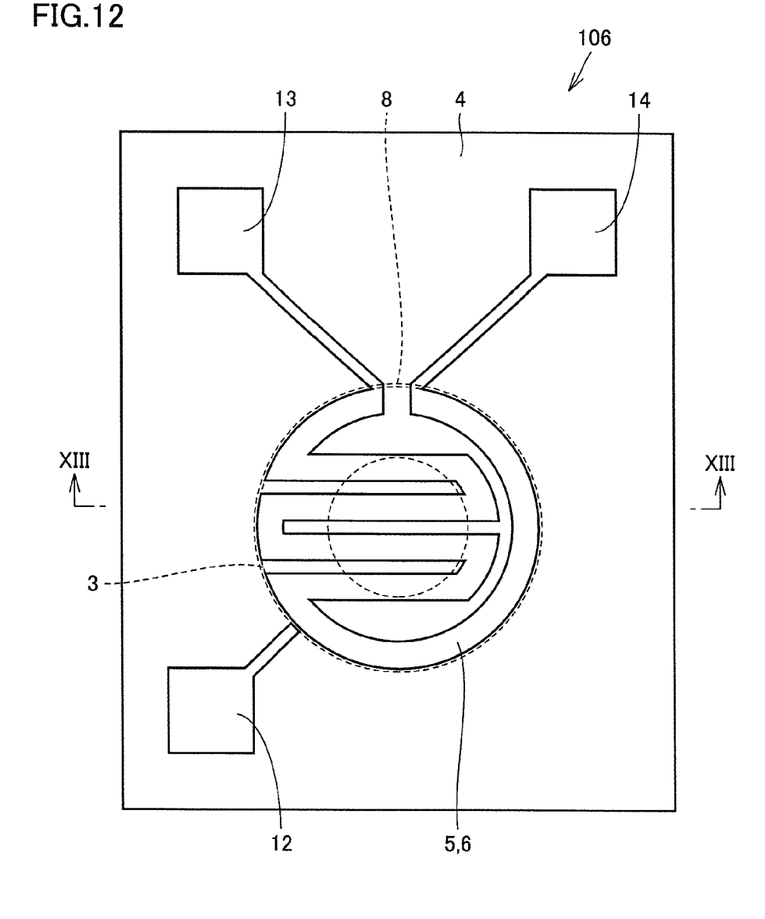
FIG. 12 is a plan view of a piezoelectric device of embodiment 6 of the present invention.
Figure 13:
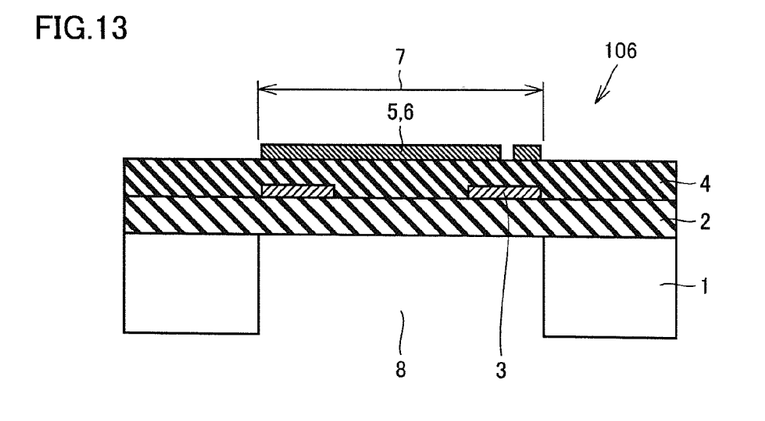
FIG. 13 is a sectional view looking in the direction of arrows and taken along line XIII-XIII in FIG. 12.
Figure 14:
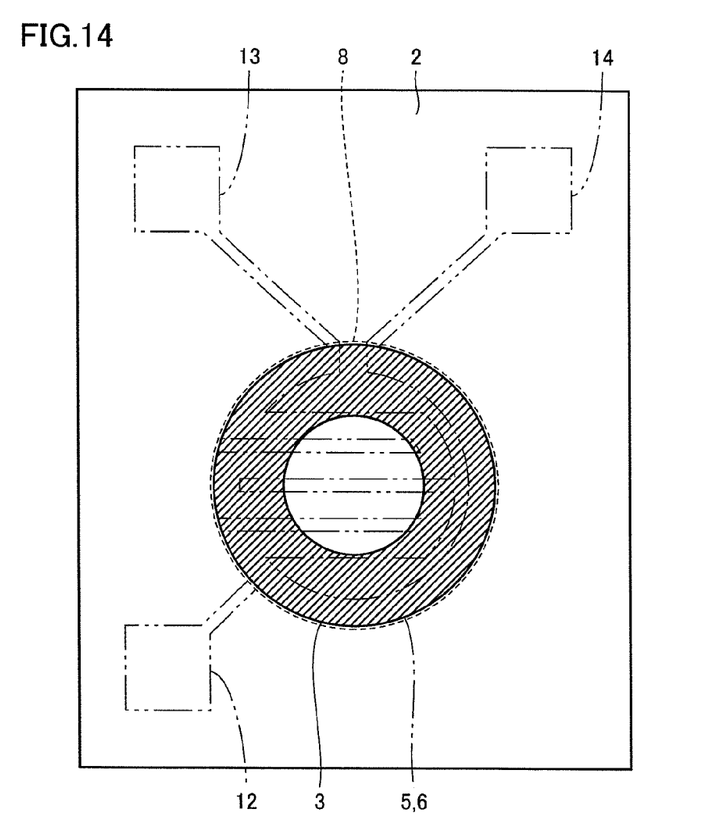
FIG. 14 is an explanatory diagram of a lower electrode of a piezoelectric device of embodiment 6 of the present invention.

A piezoelectric device according to embodiment 6 of the present invention will be described while referring to FIGS. 12 to 14. FIG. 12 is a plan view of a piezoelectric device 106 according to this embodiment. FIG. 13 is a sectional view looking in the direction of arrows and taken along line XIII-XIII in FIG. 12. FIG. 14 illustrates a state in which the piezoelectric layer 4 and members above the piezoelectric layer 4 have been removed from the piezoelectric device 106. In FIG. 14, members that exist this side of the lower electrode 3 are illustrated using two-dot chain lines.

The basic configuration of the piezoelectric device 106 according to this embodiment is similar to that of the piezoelectric device 105 described in embodiment 5. However, there is the following difference. In the piezoelectric device 105, the lower electrode 3 is arranged so as to be superimposed with a central portion of the upper electrode 5/heater 6, whereas, in the piezoelectric device 106, the lower electrode 3 is arranged so as to be superimposed with an outer peripheral portion of the upper electrode 5/heater 6. In other words, the lower electrode 3 is arranged in a ring shape so as to extend along an outer edge of the through hole 8 on the inside of the through hole 8. The shape of the lower electrode 3 is illustrated more clearly in FIG. 14.

The same effects as in embodiment 5 can be obtained in this embodiment as well.

In addition, the presently disclosed embodiments are illustrative in all points and should not be interpreted as limiting. The scope of the present invention is not to be defined by the above description but rather by the scope of the claims, and equivalents to the scope of the claims and all modifications within the scope of the claims are to be included within the scope of the present invention.

The present invention can be used in piezoelectric devices.

REFERENCE SIGNS LIST 1 substrate, 2 support layer, 3 lower electrode, 4 piezoelectric layer, 5 upper electrode, 6 heater, 7 membrane part, 8 through hole, 11, 12, 13, 14 electrode, 15 wiring line.

The invention claimed is:

1. A piezoelectric device comprising:
a substrate defining an opening therein;
a piezoelectric layer arranged above the substrate such that at least part of the piezoelectric layer extends over the opening and forms a membrane part that is not superimposed with the substrate;
a first electrode that is arranged between the piezoelectric layer and the substrate in at least the membrane part;
a second electrode that is arranged above the piezoelectric layer so as to face at least part of the first electrode with the piezoelectric layer interposed therebetween in the membrane part; and
a heater arranged above the piezoelectric layer and separate from the upper electrode, wherein the heater extends over the opening of the substrate and overlaps the piezoelectric layer.

2. The piezoelectric device according to claim 1, wherein the opening in the substrate is a through hole and the membrane part is provided so as to be superimposed over the through hole.

3. The piezoelectric device according to claim 1, further comprising a protective film that covers the second electrode and the piezoelectric layer.

4. The piezoelectric device according to claim 3, wherein a main material of the protective film is AlN.

5. The piezoelectric device according to claim 1, wherein a main material of the piezoelectric layer is AlN.

6. The piezoelectric device according to claim 1, further comprising a support layer between the substrate and the piezoelectric layer.

7. The piezoelectric device according to claim 6, wherein a main material of the support layer is AlN.

8. The piezoelectric device according to claim 1, wherein at least part of the heater has a meandering shape in a plan view of the piezoelectric device.

9. The piezoelectric device according to claim 1, wherein the heater is on a same surface of the piezoelectric device as the second electrode.

10. A piezoelectric device comprising:
substrate defining an opening therein;
a piezoelectric layer arranged above the substrate such that at least part of the piezoelectric layer extends over the opening and forms a membrane part that is not superimposed with the substrate;
a first electrode that is arranged between the piezoelectric layer and the substrate in at least the membrane part; and
a second electrode that is arranged above the piezoelectric layer so as to face at least part of the first electrode with the piezoelectric layer interposed therebetween in the membrane part, at least part of the second electrode being configured as a heater, and wherein the heater extends over the opening of the substrate and overlaps the piezoelectric layer.

11. The piezoelectric device according to claim 10, wherein the opening in the substrate is a through hole and the membrane part is provided so as to be superimposed over the through hole.

12. The piezoelectric device according to claim 10, further comprising a protective film that covers the second electrode and the piezoelectric layer.

13. The piezoelectric device according to claim 12, wherein a main material of the protective film is AlN.

14. The piezoelectric device according to claim 10, wherein a main material of the piezoelectric layer is AlN.

15. The piezoelectric device according to claim 10, further comprising a support layer between the substrate and the piezoelectric layer.

16. The piezoelectric device according to claim 15, wherein a main material of the support layer is AlN.

17. The piezoelectric device according to claim 10, wherein at least part of the heater has a meandering shape in a plan view of the piezoelectric device.

* * * * *